United States Patent [19]

Chevillat et al.

[11] Patent Number: 4,775,988

[45] Date of Patent: Oct. 4, 1988

[54] METHOD FOR RAPID GAIN ACQUISITION IN A MODEM RECEIVER

[75] Inventors: Pierre R. Chevillat, Kilchberg; Dietrich G. Maiwald, Wadenswil; Gottfried Ungerboeck, Langnau a.Albis, all of Switzerland

[73] Assignee: International Business Machines Corporation, Armonk, N.Y.

[21] Appl. No.: 888,598

[22] Filed: Jul. 23, 1986

[30] Foreign Application Priority Data

Aug. 28, 1985 [EP] European Pat. Off. ........ 85110808.4

[51] Int. Cl.⁴ .......................................... H04L 27/08
[52] U.S. Cl. .......................................... 375/98; 375/13
[58] Field of Search .......................... 375/12, 13, 98; 455/245, 246, 251, 252; 358/174; 381/107, 108; 330/278

[56] References Cited

U.S. PATENT DOCUMENTS

| | | | |
|---|---|---|---|
| 3,715,665 | 2/1973 | Chang | 375/13 |
| 4,003,006 | 1/1977 | Mandeville et al. | 375/12 |
| 4,439,864 | 3/1984 | Qureshi | 375/98 |
| 4,458,355 | 7/1984 | Motley et al. | 375/98 |
| 4,499,586 | 2/1985 | Cafarella et al. | 375/98 |
| 4,623,934 | 11/1986 | Taylor | 358/17 X |
| 4,625,240 | 11/1986 | Yablonski et al. | 375/98 |

Primary Examiner—Robert L. Griffin
Assistant Examiner—Stephen Chin
Attorney, Agent, or Firm—Gerald R. Woods

[57] ABSTRACT

For adaptively adjusting the gain in a modem receiver comprising two amplifiers (15, 19), the following steps are performed: for a buffer (21), a Hilbert filter (23), and an equalizer (27), a respective energy indicator ($P_{max}^2$, $u_{avg}^2$, $x_{avg}^2$) is generated from the signal samples in the respective delay line. Each energy indicator is compared to an associataed upper target level ($4L_U$, $3L_P$, $1.19\ L_X$), and for the equalizer also to an associated lower target level ($0.84\ L_X$). If necessary, a gain correction factor (S) initially set to 1.0 is modified to obtain an overall gain that keeps delay line energies within desired targets. Target comparisons are made so that excess energy in the buffer or Hilbert filter result in a rapid gain reduction whereas average equilizer energy is used for slow adaptations. After a gain change, all acquired samples in the delay lines are also multiplied by the correction factor (S) so that none is lost during gain acquisition. Gain is distributed between the two amplifiers in a swapping operation without modifying the adjusted overall gain.

15 Claims, 4 Drawing Sheets

MODEM RECEIVER BLOCK DIAGRAM

FIG. 1 MODEM RECEIVER BLOCK DIAGRAM

GAIN ADJUSTMENT PROCEDURE

GAIN CHANGE
AND
RESCALING
PROCEDURE

SWAPPING PROCEDURE

METHOD FOR RAPID GAIN ACQUISITION IN A MODEM RECEIVER

FIELD OF INVENTION

Present invention relates to modems used for transmission of data over telephone lines, and in particular to a method for the rapid acquisition of the gain in such modems during the initial training phase of the receiver.

BACKGROUND

Transmitting digital data over a telephone network or line requires the use of modems. In the sending modem, a carrier signal is modulated by the data. In the receiving modem, the signal is demodulated to restore the original data.

Because the transmission channel introduces distortion, the modem receiver employs an equalizer for compensating the resulting inter-symbol interference. For every transmission, input amplifier and equalizer must be set to reflect the current transmission characteristics of the channel. Furthermore, carrier synchronization and symbol timing recovery have to be performed.

For setting the parameters in the modem receiver prior to actual data transmission, a so-called training sequence is sent whose elements are known to both, transmitter and receiver. The channel characteristics can then be derived from the received training signal, allowing the receiver to carry out initial gain setting, equalizer training, symbol synchronization, and acquisition of carrier phase and frequency.

The signal level at the receiver input is not known to the modem receiver prior to receiver training. The signal level thus has to be measured by the receiver, and the gain of the receiver input amplifier has to be set so that all signal values are kept within a range acceptable for the units processing these signal values, i.e., preventing signal clipping in the A-to-D converter, and numerical overflow or underflow in receiver filter or equalizer. If more than one amplifier is used, e.g., an analog input amplifier before and a digital amplifier after A-to-D conversion, the gains of both have to be set.

Use of a training sequence was described e.g. in U.S. Pat. No. 4,089,061 (A. T. Milewski) entitled "Method and apparatus for determining the initial values of a complex transversal equalizer". In the system described in this prior art reference, a periodic training signal is used, i.e. one that repeats a basic short sequence periodically.

In some modem receivers, two amplifiers are used: An analog programmable gain amplifier (PGA) for the input signal and a digital amplifier for the digitized samples. The articles by C. Galand et al. "Programmable gain amplifier", IBM Technical Disclosure Bulletin, December 1984, p. 3722 and by C. Couturier et al. "Programmable gain amplifier improvement", IBM Technical Disclosure Bulletin, February 1985, p. 5456, described some features of PGAs. In known modem receivers using a combination of two amplifiers, the gains of the amplifiers were set to a compromise value prior to the reception of a training signal, and then the actual level of a received preliminary test signal was measured. Thereafter, the gains were changed to their appropriate values and reception of an equalizer training signal was started. The samples of the initial test signal already accumulated in filter and equalizer delay lines were discarded after this gain adjustment because they could not be used for equalizer training. This method leads to undesirable delays during modem receiver training, and causes long modem startup times.

Of key interest in modem receiver training is the time required for the training operation. In particular, in multidrop polling systems where the control modem receives many short messages from different tributary modems, the receiver has to adapt to the characteristics of a different telephone channel for each message. The time required for training the modem receiver thus has a strong influence on data throughput. Similarly, when operating in half-duplex transmission, the startup time of the receiving modem contributes significantly to the turn-around delay.

OBJECTS OF THE INVENTION

It is an object of the invention to devise a method for rapidly setting the gain in a data modem receiver during a training procedure.

Another object of the invention is a gain acquisition procedure which prevents loss of any portion of a received training signal although substantial gain changes are carried out during initial training.

A further object of the invention is a gain acquisition method which instantaneously reduces the gain when the signal values exceed a given threshold.

Another object of the invention is a gain adjustment procedure which allows the combined setting of gains for two separate amplifiers and an adaptation of the gain distribution between these two amplifiers, without loss of time or signal portions.

Another object of the invention is a procedure for initial gain acquisition which can be used continuously also for gain adjustment during normal data transmission operation.

DISCLOSURE OF THE INVENTION

For achieving these objects, the invented method provides, in a modem receiver comprising in sequence a sample buffer, a filter and an equalizer, and which includes two amplifiers, the determination of a total gain factor in response to the energy of the samples contained in the buffer, filter, and equalizer, and the adjustment of the gains of the two amplifiers so that the total gain factor which was determined is achieved. In a further step, the samples already contained in the buffer, in the filter, and in the equalizer which correspond to a previous gain factor, are rescaled in accordance with the newly selected total gain factor so that none of the samples have to be discarded.

With the new gain acquisition procedure, the gain of a modem receiver can be adaptively adjusted to the required value within a few symbol intervals of the training signal.

Further features and advantages of the invention will become apparent from the following detailed description of a preferred embodiment in connection with the accompanying drawings.

LIST OF DRAWINGS

FIG. 1: Block diagram of a modem receiver in which the invention is implemented;

FIG. 2: Flow diagram of the basic gain adjustment procedure;

FIG. 3 Flow diagram of the gain range testing and gain change operation, and of the rescaling operations for adapting available samples to the new gain;

FIG. 4: Flow diagram of the swapping procedure for distributing the total gain G to two components G1 and G2.

DETAILED DESCRIPTION

(1) Concept of Invention

The rapid gain acquisition procedure of the invention is based on the following principle: From the peak value of the signal samples in the input buffer, and from the average energy of the samples in the receiver filter and equalizer, it is determined whether the gains of amplifiers must be changed. A new overall gain factor is determined and the gains are changed in large steps if a rapid decrease is necessary, in smaller steps for a fine adaptation in both directions (increase or decrease). None of the samples already accumulated is discarded. All available samples are rescaled in response to a gain change so that despite rapid initial gain changes no portion of the signal is lost and the full training signal from its beginning contributes to modem training.

Distribution of the overall gain to the two amplifiers is done separately after overall gain adaptation, keeping each amplifier in its optimum range. Again, no portion of the signal is lost because the gain distribution operation keeps the overall gain constant.

(2) Receiver Structure and Organization

Figure 1:
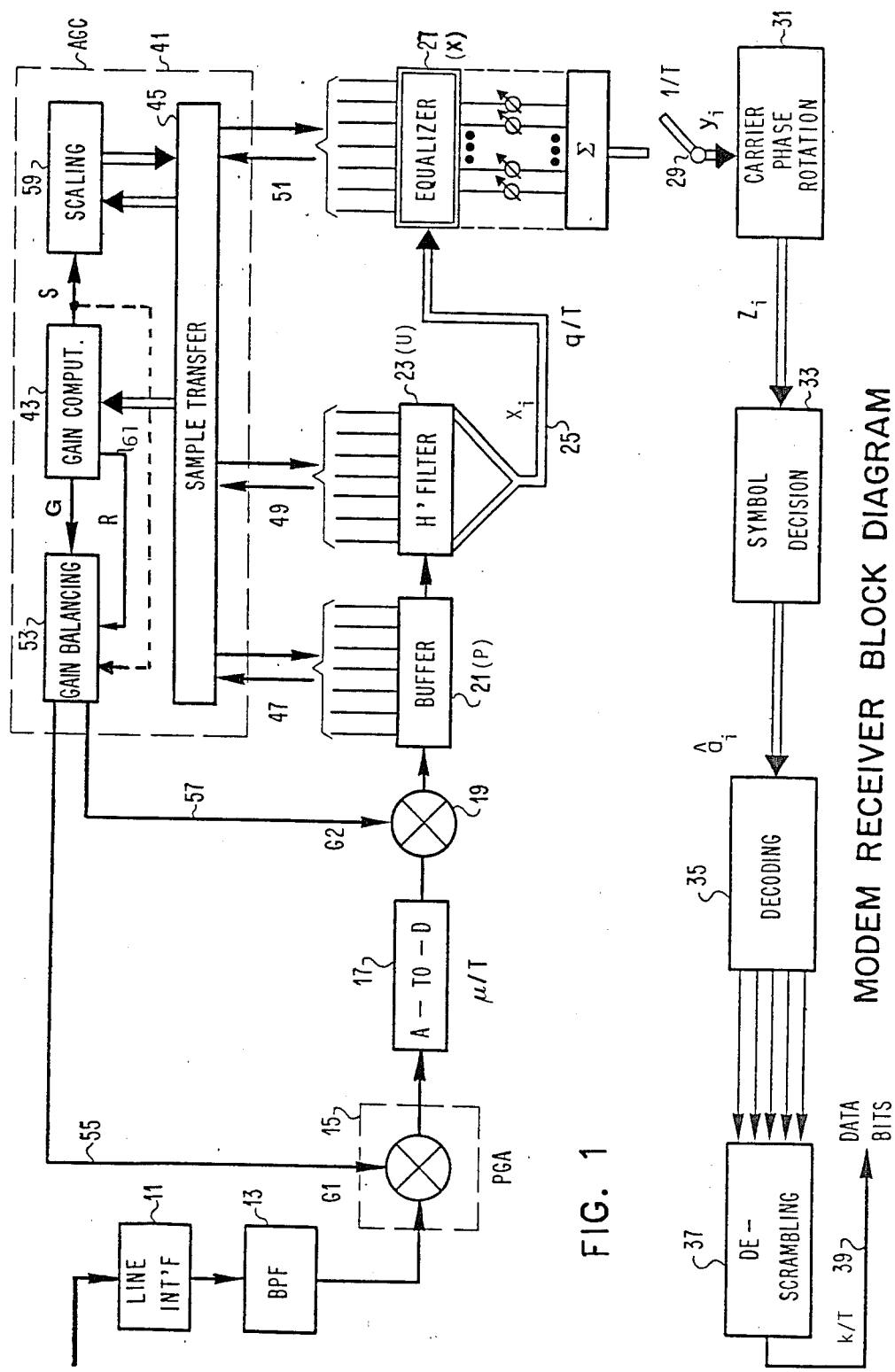

Reference is made to the block diagram FIG. 1 which shows a voiceband data-modem receiver in which present invention is used. The signal received via line interface 11 is filtered by an analog bandpass filter (BPF) 13 to reject out-of-band noise and to prevent aliasing, passes through a programmable gain amplifier (PGA) 15 with analog gain G1, and is then sampled at rate $\mu/T$ (typically $\mu=4$ or 6) in an A-to-D converter 17. The sampling time of the A-to-D converter is derived from the received signal. The samples are multiplied in a digital amplifier 19 by gain G2 before entering a buffer 21 which has a capacity of $\mu$ samples, from where they are transferred to a Hilbert matched filter 23. Gains are controlled by the AGC (automatic gain control) mechanism described below.

After reconstruction of the complex bandpass signal by the Hilbert filter, the complex signal samples $\{x_i\}$ which appear at a rate $q/T$ on lines 25 are fed into an adaptive equalizer 27 with N complex coefficients spaced at intervals $T/q$, where typically $q=2$. The equalizer output is sampled at rate $1/T$ by sampling means 29 to obtain samples $\{y_i\}$. After compensation of frequency offset and carrier-phase jitter in carrier phase rotation circuitry 31, the samples $\{z_i\}$ enter a decision circuit 33 which produces symbol estimates $\{\hat{a}_i\}$. A symbol decoder 35 then maps the symbol decisions into the corresponding k binary digits which are unscrambled in descrambling unit 37. Data bits are released on the receiver output line 39 at rate $k/T$.

For implementing the invention, the modem receiver has an automatic gain control section 41 (AGC) which comprises in particular gain computation means 43. Gain computation means 43 is connected via sample transfer circuitry 45 and lines 47, 49, and 51 to output taps of buffer 21, Hilbert filter 23, and equalizer 27, respectively, for receiving samples from these units. Gain computation means 43 furnishes a current gain value G (representing the total gain required) to gain balancing means 53 which provides individual gain values G1 and G2 on lines 55 and 57, respectively, to the programmable gain analog amplifier 15 and the digital amplifier 19. Gain computation means 43 also furnishes a gain correction factor S to scaling means 59 which are also connected via sample transfer circuitry 45 and lines 47, 49, 51 to the buffer 21, Hilbert filter 23, and equalizer 27, respectively, for exchanging samples with them. In particular, samples extracted from these units can be multiplied by the factor S in scaling means 59 and then stored back into their units. The scaling factor S can also be provided to gain balancing means 53 in a particular embodiment, to adjust the overall gain G in gain balancing means 53. Reference signals (R) can be provided by gain computation means 43 on line 61 to gain balancing means 53, e.g. a nominal value $G2_{NOM}$ for the digital gain, or the available gain factors (PG) for the programmable-gain analog amplifier.

Before transmitting data, the modem transmitter sends a periodic training signal. The symbols $\{b_k\}$ of this signal have constant amplitude thereby facilitating gain acquisition. Also, to permit cyclic equalization, the training signal has a flat amplitude spectrum. Training sequences having both properties are called Constant Amplitude Zero Auto Correlation (CAZAC) sequences and are described e.g. in the above mentioned U.S. Pat. No. 4,089,061.

Received modem signals exceed the channel noise by at least 10 dB but the receive level can vary over a range of 43 dB according to telephone line specifications. Consequently, in the absence of a modem signal, the overall gain $G=G1\cdot G2$ of the receiver has to be large in order to obtain maximal sensitivity. In response to an incoming training signal, the gain may have to be reduced very rapidly to prevent amplitude clipping by the A-to-D converter and arithmetic overflow in other processing stages of the receiver. AGC operation adjusts the gain G such that the signal energy in the equalizer delay line is stabilized at its target value by the time a full period of the training signal has been received.

(3) Rapid Gain Acquisition

In the modem receiver of FIG. 1, the received training signal after sampling at rate $\mu/T$ is of the form $$u_n = u(n\,\mu/T) = \qquad (1)$$

$$G_1 G_2 Re\left\{\left(\sum_i h_i b'_{n-i}\right)e^{j2\pi \Delta f nT/\mu}\right\} + w_n,\ n = 0, 1, 2, \ldots$$

where $b'_{n-i}=b_k$ (with $k=(n-i)/\mu$) if $(n-i)$ mod $\mu=0$ and $b'_{n-i}=0$ elsewhere, i.e., the symbols $\{b_k\}$ of the periodic CAZAC training sequence are interleaved with $\mu-1$ zeros. Signal element $h_i$ describes the overall complex response of the transmission system up to the input of the Hilbert filter, $\Delta f$ is a frequency offset, and $w_n$ denotes additive noise.

Whether both, analog gain G1 and digital gain G2, have to be controlled during rapid gain acquisition depends primarily on the amplitude range of the received modem signal and the resolution provided by the A-to-D converter. Leaving G1 constant and adjusting only G2 requires an A-to-D converter with at least 14 bits in order to cover the required amplitude range of 43 dB and still have enough significant bits ($\geq 7$ bits) for an accurate signal representation.

If the A-to-D converter has a resolution of less than 14 bits, analog gain G1 must be set adaptively during receiver startup and possibly throughout data reception in order to maintain an adequate amplitude level at the input of the A-to-D converter. Usually the gain of a programmable gain amplifier can be stepped only by factors of two, thus fine adjustment of the received signal level has to be done digitally using G2. When controlling G1, the inherent delay between analog front end and digital processing has to be taken into account. In the following description of AGC operations, subdivision of G into its components G1 and G2 is considered a separate feature and will be addressed below. Thus the overall gain $G = G1 \cdot G2$ is the parameter of first interest.

During receiver startup, rapid adjustment of the gain is performed in three staged control steps:

(1) The peak squared-amplitude value of $\mu$ new signal samples in buffer 21 (P) is held below a level $L_P$ which makes clipping or overflow of future samples unlikely;

(2) the average signal energy in the delay line (U) of the Hilbert matched filter 23 is controlled to stay below a value $L_U$ which is small enough to prevent arithmetic overflow in the computations of the phase-splitter output; and (3) the average energy in the delay line (X) of equalizer 27 is adjusted towards a target level $L_X$ chosen to meet the precision requirements for subsequent processing of the received signal.

In the environment of fixed-point arithmetic it is appropriate to express signal values as fractions of the largest representable number "UNITY" $= 2^{B-1}$, where B is the data width of the signal processor in bits. Signal levels in the receiver chain are adjusted such that the expected signal amplitudes $E\{|x|\}$ in the equalizer and $E\{|u|\}$ in the Hilbert filter are $$E\{|x|\} = 2 E\{|u|\} = 1/r, \qquad (2)$$

where typically $r=4$. This leaves sufficient margin against overflow and takes into account the larger variance of the signal in the Hilbert filter. Consequently, the three target energy levels of interest are $$L_P = E\{|u|\}^2 = 1/(2r)^2, \qquad (3)$$

$$L_U = \mu \cdot E\{|u|\}^2 = \mu/(2r)^2, \qquad (4)$$

$$L_X = q \cdot E\{|x|\}^2 = q/r^2. \qquad (5)$$

In every symbol interval T the average signal energies in delay lines U and X are determined. Since delay line U spans only a few symbol intervals (typically $L/\mu 6 \ldots 8$), single-pole lowpass filtering is used for estimating the average energy in the Hilbert filter $$u^{2\,new}_{avg} = (1 - \epsilon_1) u^{2\,old}_{avg} + \epsilon_1 \sum_{i=1}^{\mu} u_i^2, \qquad (6)$$

where $\epsilon_1 = 1/16$ is an appropriate value. The equalizer typically contains information of $M = N/q = 20 \ldots 40$ symbol intervals and requires more accurate averaging. Leaky addition and subtraction of signal energy entering and leaving the equalizer delay line yields satisfactory results:

$$|x|^{2\,new}_{avg} = (1 - \epsilon_2) |x|^{2\,old}_{avg} + \alpha \sum_{i=1}^{q} |x_i|^2 - \beta \sum_{i=N+1}^{N+q} |x_i|^2, \qquad (7)$$

where $$\epsilon_2 = \alpha - \beta,$$

$$\alpha = \epsilon_2/(1 - (1 - \epsilon_2)^M), \qquad (8)$$

$$\beta = \alpha(1 - \epsilon_2)^M.$$

Appropriate values for $\epsilon_2$ are $1/512 \ldots 1/256$.

Once per symbol interval T the peak squared-amplitude value in buffer P and the energy estimates (6) and (7) are compared with $L_P$, $L_U$, and $L_X$, respectively, and a correction factor S for adjusting the gain is derived. Since clipping of the input signal and arithmetic overflow are catastrophic to further processing, gain adjustment is tuned to react extremely fast to an increase in the signal level but only moderately fast to a decreasing level. Consequently, if the peak in buffer P is too large, G is reduced instantly by multiples of 2 ($=-6$ dB), whereas too small a peak in P leads to no immediate action. Similarly, only if the Hilbert filter energy exceeds the limit $3 \cdot L_U$, gain G is reduced by a fixed amount of 6 dB. Fine adjustment of G which stabilizes the signal level in the equalizer around the target energy $L_X$, is performed in 1-dB steps if neither of the other gain reduction was initiated recently.

After having performed a coarse scaling (i.e., $S \leq 0.5$), any fine scaling is suppressed during the subsequent D symbol intervals (an appropriate delay count is, e.g., $D=8$). This reduction of fine scaling activity not only maintains a higher numerical precision of the signal samples (less fixed-point multiplications which tend to produce round-off errors) but also prevents unnecessary gain oscillations during periods of large amplitude changes, thereby speeding up the gain acquisition process. Level adjustments are inhibited in case the new gain value G would fall outside the implementation bounds.

It should be noted that in the embodiment described here, any change in the overall gain G is first effected by changing the digital gain G2 correspondingly and leaving the analog gain G1 of the programmable gain amplifier unchanged. Correct distribution of the total gain G between the two gains G1 and G2 is done subsequently in a swapping operation as will be described with reference to FIG. 4.

Whenever the gain is changed (and thus $S \neq 1.0$), signal samples already received in the Hilbert filter and equalizer delay lines are not discarded but are multiplied by the correction factor S. This makes samples acquired earlier appear as if they had been received with the updated gain value and signal processing can continue uninterrupted.

Figure 2:
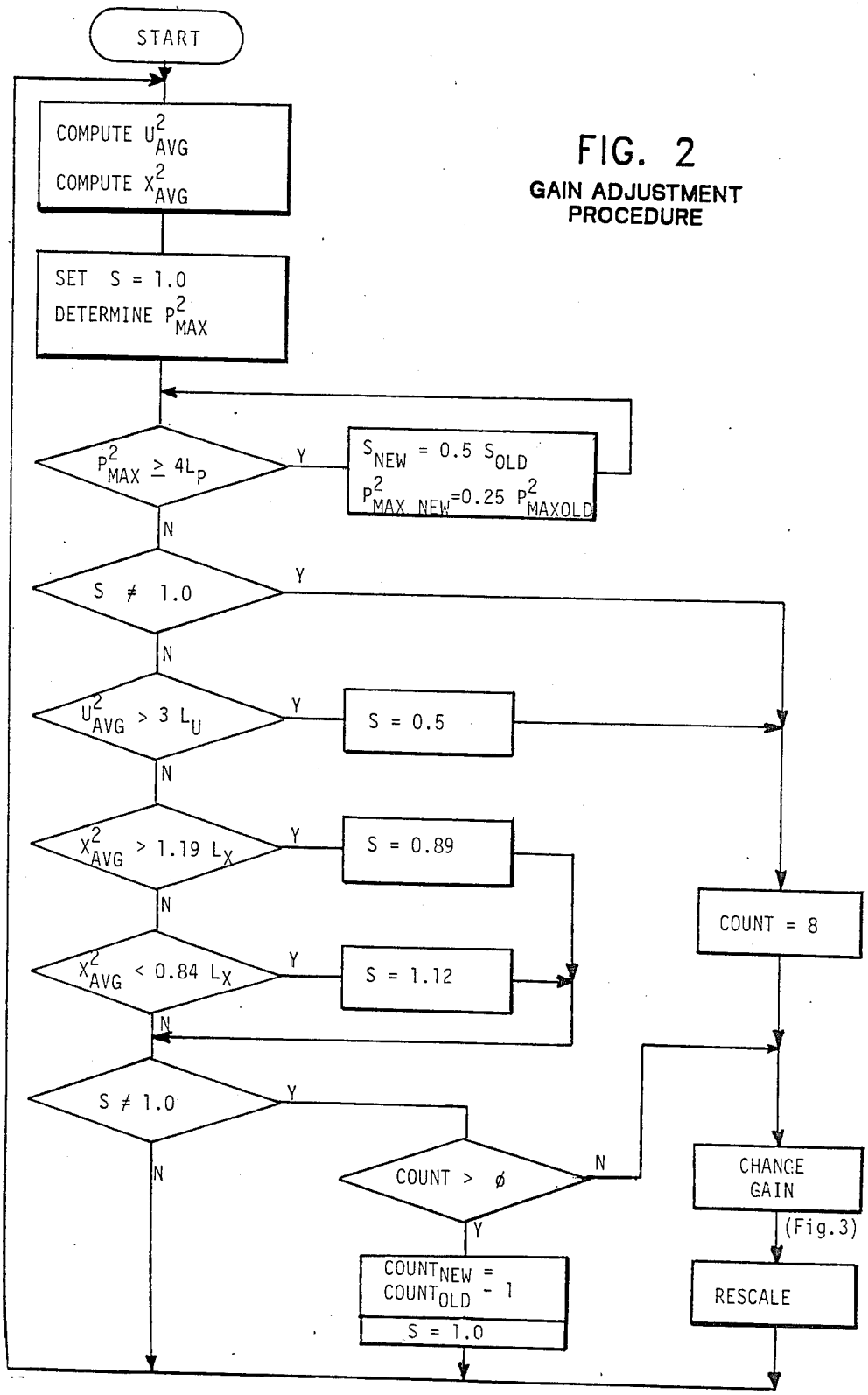
Figure 3:
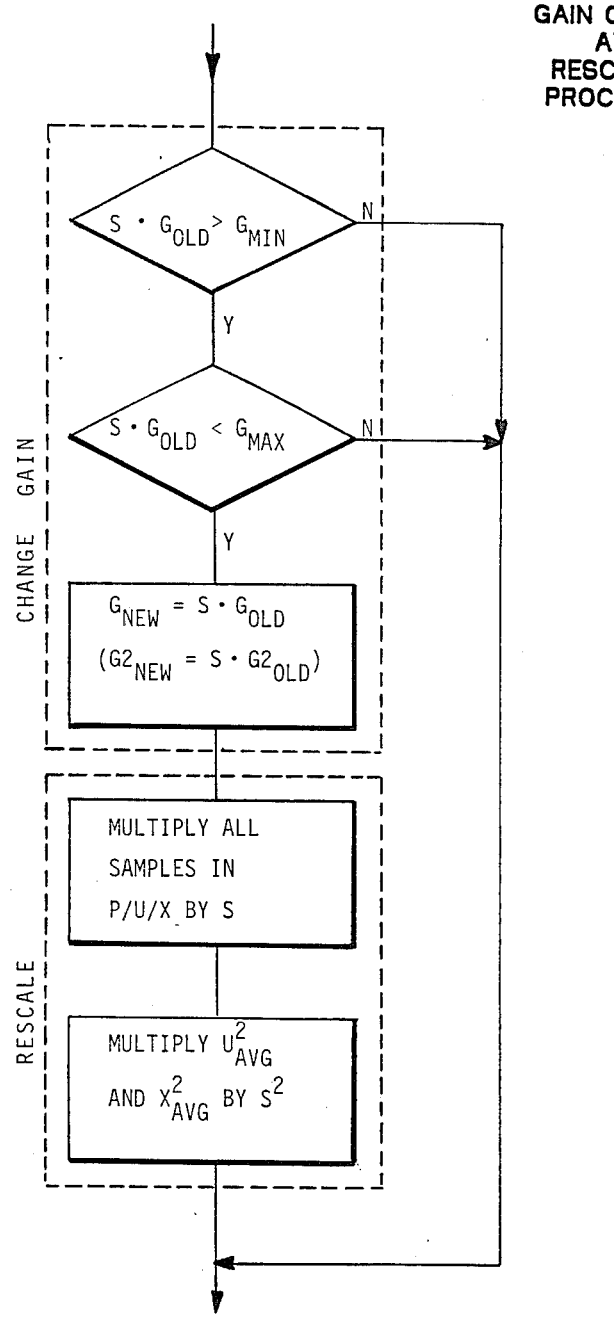

The following is a short description of the procedure for initially setting and adjusting the gain in the modem receiver in response to the energy of the samples contained in the delay lines (buffer, Hilbert filter, equalizer); a flow diagram of this procedure is shown in FIG. 2, with more details on the gain change and the rescaling operations given in FIG. 3. The procedure is executed once in every symbol interval T. An algorithmic description of this gain acquisition procedure is given in Appendix 1 of this specification.

(a) Target energy levels $L_P$, $L_U$, and $L_X$ for the three delay lines are defined, as well as values for the correction factors $\epsilon_1$ and $\epsilon_2$. At the beginning of the procedure, the correction factor S for the gain G is set to $S = 1.0$.

(b) Using the samples $u_i$ and $x_i$ contained in delay lines U and X, the average energy in both delay lines is determined in accordance with (6) and (7). Appropriate initial values for $u^2_{avg}$ and $x^2_{avg}$ are initially selected (e.g. zero after clearing the delay lines).

(c) Using the samples $p_i$ in buffer 21, the peak squared-amplitude value is determined by computing all values $p_i^2$ and selecting the maximum value $p_{max}^2$.

(d) The peak value $p_{max}^2$ is compared to the target value $L_P$ and as long as it is greater than or equal to $4L_P$, the correction factor S is decreased in steps by a factor of 0.5, and the peak value $p_{max}^2$ is decreased by a factor of 0.25 for each such step. When the target value is reached, the current correction factor S is used to change the gain G and to rescale all samples in the delay lines P, U, and X. A delay count is set to D=8, and then the procedure is started again in the next symbol interval.

(e) If at the beginning of step (d), the peak energy value $p_{max}^2$ of the buffer was already below the target, the average energy in the Hilbert filter is checked by comparing $u_{avg}^2$ to the target value $L_U$. If it is greater than $3L_U$, the correction factor is set to S=0.5. Then, the correction factor S is used to change the gain G and to rescale all samples in the delay lines P, U, and X. A delay count is set to D=8, and then the procedure is started again in the next symbol interval.

(f1) If at the beginning of step (e) the average energy in the Hilbert filter was already below the target, the average energy in the equalizer delay line is checked by comparing it against values 1.19 $L_X$ and 0.84 $L_X$ which are 0.75 dB above and below the target value $L_X$, respectively. In response, the correction factor is either set to S=0.89 (decrease by 1.00 dB), set to S=1.12 (increase by 1.00 dB), or left at S=1.0.

(f2) If then the correction factor is still S=1.0, the procedure is finished and a new procedure is started in the next symbol interval. If the correction factor was changed, a test is made whether the current delay count D is above zero. If it is still higher than zero (indicating a recent coarse change of the gain factor), it is decreased by 1, and the procedure is finished and a new procedure is started in the next symbol interval (after setting S=1.0). If, however, the delay count D already reached zero, a fine adaptation is made by multiplying the gain factor G by the correction factor S, and all samples in the delay lines P, U, and X are rescaled by the factor S. Then, the procedure is finished.

(g1) The gain adjustment operation performed at the end of steps (d), (e), or (f) works as follows: The gain factor G is multiplied by the correction factor S, and a test is made whether the resulting $G_{NEW}=S \cdot G_{OLD}$ is still between two target values $G_{MAX}$ and $G_{MIN}$. The new gain factor becomes only effective if it is between these target values; otherwise the old gain factor is maintained and no rescaling occurs.

(g2) In effect, in present embodiment the adjustment of the total gain G is implemented by first adjusting the digital gain G2 so that $G2_{NEW}=S \cdot G2_{OLD}$. correction factor S is transferred to gain balancing means 53 which adjusts G2 as indicated. (Immediately thereafter, distribution of the total gain between G1 and G2 is done as described in Section 4.)

(h) The rescaling operation done at the end of steps (d), (e), or (f) (but only if the gain G was actually changed by a factor S≠1) works as follows: Each individual value $p_i$, $u_i$, and $x_i$ in the three delay lines is multiplied by the current correction factor S. Thereafter, the two average energy values $u_{avg}^2$ and $x_{avg}^2$ are rescaled by multiplying them by a factor $S^2$.

In present embodiment, steps (a) ... (g1) of this procedure, except for the actual gain change and scaling operations, are executed by gain computation means 43, whereas the actual gain change of step (g2) and scaling operation of step (h) are executed by scaling means 59 shown in FIG. 1.

Upon reception of a CAZAC training signal the described mechanism performs rapid gain adjustment without distorting the incoming signal. This guarantees correct signal acquisition and establishes the target energy level $L_X$ as soon as the equalizer delay line is filled with a complete period of the training signal. Thus the AGC mechanism presented is well suited for modem receivers using a fast startup technique as described in above-mentioned U.S. Pat. No. 4,089,061.

(4) Gain Control and Swapping

The AGC procedure described was incorporated in a 2400-baud modem which was realized using a programmable signal processor built in MSI-TTL technology (as described in an article "The SP16 Signal Processor" by Ungerboeck et al., IEEE Proceedings ICASSP84, pp. 16.2.1–16.2.4.). The modem receiver employs an adaptive equalizer of length 32T with N=64 T/2-spaced coefficients, and a 24-tap Hilbert matched filter of length 6T. The A-to-D converter operates at the rate of 9600 samples per second corresponding to an oversampling factor $\mu=4$. The CAZAC training sequence has a period of 32 symbol intervals. Startup times as low as 20 msec are achieved with this modem.

The A-to-D converter of the modem receiver has only 12 bits of amplitude resolution. In order to increase the dynamic range, a PGA (programmable gain amplifier) with five programmable 6-dB steps (PG=0 ... 4, resulting in amplifications 0 dB ... 24 dB) is provided. The analog front end is designed to accommodate the maximal input level of 0 dBm with the PGA set to 0 dB amplification (PG=0, G1=1). In this case, the A-to-D conversion yields a digital representation of the incoming signal which fully exploits the 12-bit resolution of the A-to-D converter. Leaving G1=1 fixed and applying the AGC procedure described in Section 3 exclusively to the adjustment of digital gain G2 assures that, in the steady state, the signal energy $L_X$ in the equalizer is on target. Saller input levels will be compensated by increasingly larger steady-state values G2. This will ultimately lead to a very coarse digital representation of the received signal, unless amplification by the PGA is stepped up to 6 dB (PG=1, G1=2) and higher.

Figure 4:
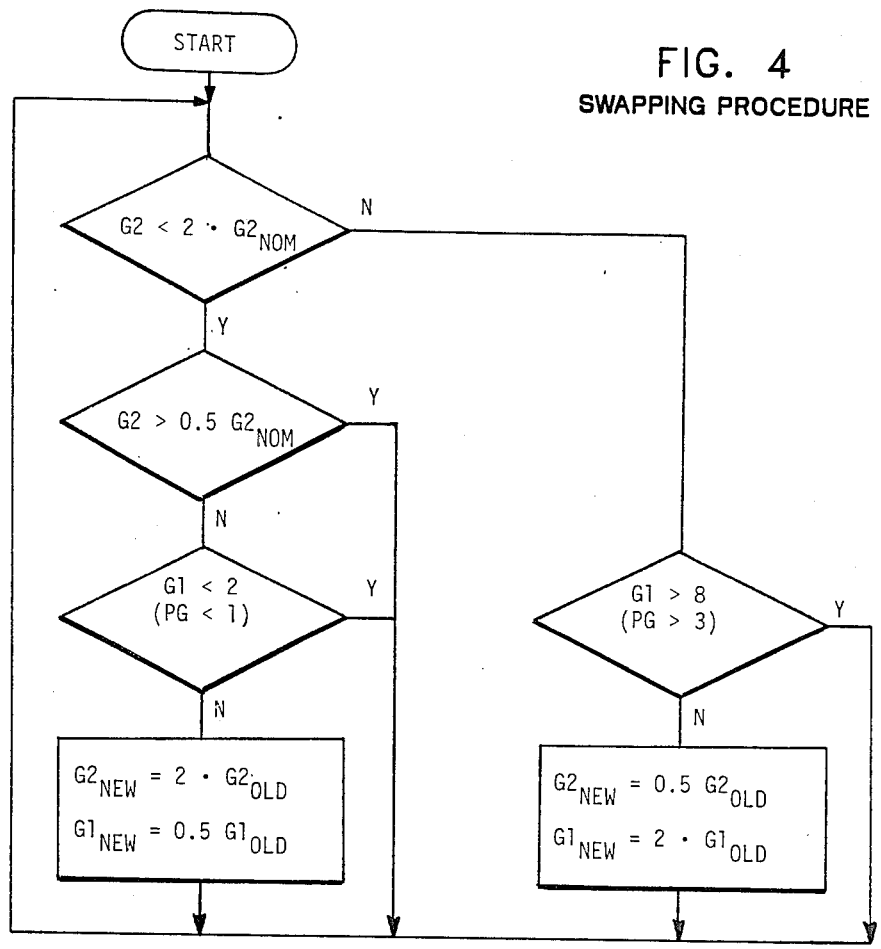

The necessary adjustment of G1 is accomplished by succeeding automatic gain control presented in Section 3 with a gain-balancing procedure executed by gain balancing means 53. It performs automatic "swapping" of digital and analog gains (G2 and G1) in 6-dB steps whenever G2 differs sufficiently from its design value $G2_{NOM}$. Once per symbol interval T the following procedure is performed; a flow diagram of this procedure is shown in FIG. 4. An algorithmic representation of the procedure is given in Appendix 2 of this specification.

The dgital gain G2 is compared to twice its nominal value $2 \cdot G2_{NOM}$ and to half of its nominal value $0.5 \cdot G2_{NOM}$. Furthermore, a decision is made whether the analog gain G1 is above its lowest value G1=1 or below its highest value G1=16. If the digital gain is greater than or equal to $2 \cdot G2_{NOM}$ and the analog gain is not yet at its highest value, G2 is decreased by a factor of 0.5 and G1 is increased by a factor of 2. If the digital gain is less than or equal to $0.5 \cdot G2_{NOM}$ and the analog gain is not yet at its lowest value, G2 is increased by a factor of 2 and G1 is decreased by a factor of 0.5. In all other cases no swapping is effected, i.e. the gain distribution is not changed. This is shown by the table in the lower left of FIG. 4.

Since the PGA can be adjusted only within five 6-dB steps covering an amplification range G1=1 ... 16, larger variations of the received signal level have to be absorbed by gain G2.

Setting of the analog gain G1 in the PGA is performed at symbol rate 1/T=2400 baud. Due to interface delays between digital and analog signal processing, the effect of modifying G1 is delayed by several symbol intervals. This has to be compensated by gain balancing unit 53 such that the overall gain $G=G1\cdot G2$ remains unchanged whether or not a gain swap was executed. A change of G2 due to swapping is delayed by gain balancing unit 53 so that samples acquired from the A-to-D converter are multiplied by the old G2 until the new G1 becomes effective.

Digital implementation of the modem receiver of FIG. 1 in a signal processor creates a delay of typically two symbol intervals between the input of an analog signal to PGA 15 and the input of the corresponding digital sample to digital amplifier 19. Thus, when a swapping occurs between G1 and G2, the new value of G1 is made effective immediately by gain balancing means 53 but the new value of G2 is made effective with a delay of two symbol intervals, so that the overall amplification of any specific sample is independent of any swapping operation.

(5) Modifications

When applying the above AGC mechanism it is taken for granted that the signal samples entering buffer 21 never overflow. In a fixed-point digital realization provisions have to be made that this is indeed the case. Here, the output samples of the A-to-D converter 17 are multiplied by a reduced gain G2/r and, before passing on the $\{p_i\}$ to the Hilbert filter delay line, their amplitudes are amplified by r to the correct values $\{u_n\}$. A scaling factor r=16 has been found appropriate and can be implemented in the 12/16/20-bit architecture of a preferred signal processor efficiently and without precision loss. Such a signal processor was described in the above mentioned article by G. Ungerboeck et al. Referring to FIG. 1, this scaling of the buffer contents can be achieved as follows: At the input of buffer 21, a fixed-value multiplication with a factor 1/r=1/16 is provided, and at the output of buffer 21, another fixed-value multiplication with a factor r=16 is provided (e.g. shift by 4 bits).

---
APPENDIX 1
GAIN ADJUSTMENT PROCEDURE
(Formal Description)
---

```
/* Compute average energy in Hilbert-filter delay line
    AUXI  = (U(1)**2+U(2)**2+ ... +U(MU)**2);
    U2AVG = (1−EPS1)*U2AVG+EPS1*AUXI;
/* Compute average energy in equalizer delay line
    X2AVG = (1−EPS2)*X2AVG
            + ALPHA*(ABS(X(1))**2+ ... +ABS(X(Q))**2)
            − BETA*(ABS(X(N+1))**2+ ... +
            ABS(X(N+Q))**2);
/* Check peak energy in buffer P
    S = 1.0;                            /* set unity scale
    P2MAX = MAX(P(1)**2,P(2)**2, ... ,P(MU)**2);
    DO WHILE (P2MAX >= 4*LP);
        S = 0.5*S; P2MAX = 0.25*P2MAX;   /* − 6 dB
```

---
-continued
APPENDIX 1
GAIN ADJUSTMENT PROCEDURE
(Formal Description)
---

```
        END;
    IF S  = 1.0 THEN DO;
        D = 8;                          /* initialize counter
        SCALE = '1'B;                   /* perform scaling
        END;
/* Check average energy in Hilbert filter
    ELSE DO;
        IF U2AVG > 3*LU THEN DO;
            S = 0.5;                    /* − 6 dB
            D = 8;                      /* initialize counter
            SCALE = '1'B;               /* perform scaling
            END;
/* Check average energy in equalizer delay line
        ELSE DO;
            IF X2AVG > 1.19*LX          /* +0.75 dB
                THEN S = 0.89;          /* −1.00 dB
            ELSE IF X2AVG < 0.84*LX     /* −0.75 dB
                THEN S = 1.12;          /* +1.00 dB
            IF S  = 1 THEN DO;
                IF D > 0 THEN DO;
                    D = D − 1;
                    SCALE = '0'B;       /* do not scale
                    END;
                ELSE SCALE = '1'B;      /* perform scaling
                END;
            ELSE SCALE = '0'B;          /* do not scale
            END;
        END;
/* Rescale signal values
    IF (SCALE = '1'B)&(S*G > GMIN)&(S*G <
        GMAX) THEN DO;
        G = S*G;                                /* gain
        DO I=1 TO MU; P(i) = S*P(i); END;       /* buffer P contents
        DO I=1 TO L; U(i) = S*U(i); END;        /* Hilbert filter
        DO I=1 TO N; X(i) = S*X(i); END;        /* equalizer contents
        U2AVG = U2AVG*S**2;                     /* Hilbert energy
        X2AVG = X2AVG*S**2;                     /* equalizer energy
        END;
```

---
APPENDIX 2
SWAPPING PROCEDURE
(Formal Description)
---

```
/* Swap digital/analog gains unless
    G2NOM/2 < G2 < 2*G2NOM
    IF G2 < 2*G2NOM THEN DO;
        IF (G2 > G2NOM/2) OR (PG < 1)   /* do nothing
            THEN;
        ELSE DO;
            G2 = 2*G2;                  /* increase digital gain by 6 dB
            PG = PG−1;                  /* decrease analog gain by 6 dB
            END;
        END;
    ELSE DO;
        IF PG > 3 THEN;                 /* do nothing
        ELSE DO;
            G2 = G2/2;                  /* decrease digital gain by 6 dB
            PG = PG+1;                  /* increase analog gain by 6 dB
            END;
        END;
```

We claim:

1. Method of adaptively adjusting the gain in a modem receiver in response to a sampled received signal, said receiver comprising the series arrangement of a programmable analog amplifier, an A-to-D converter, a digital amplifier, a buffer, a digital filter, and a digital equalizer, characterized by the following steps:

(a) determining a total gain factor (G) in response to the energy of the signal samples stored in the buffer, the digital filter, and the digital equalizer; and (b) adjusting the gain values (G1, G2) of the analog amplifier and the digital amplifier in combination so that the effective gain resulting from the two amplifiers is equal to the total gain factor (G) previously determined in step (a).

2. Method according to claim 1, characterized in that for determining the total gain factor, initially a gain correction factor (S) is set to one; that an initial buffer peak energy value ($p_{max}^2$) is determined from the samples in the buffer and is compared to a first target level ($4L_P$); that if the initial buffer peak energy value is not less than the first target level, the correction factor is stepwise reduced by a first modification factor (0.5) and that for each reduction step the buffer peak energy value ($p_{max}^2$) is reduced by the square of the first modification factor (0.25) until the resulting reduced buffer peak energy value ($p_{max}^{2r}$) is less than the first target level ($4L_P$); and that a new total gain factor ($G_{NEW}$) is then determined by adjusting the current total gain factor ($G_{OLD}$) with the resulting correction factor (S).

3. Method according to claim 2, characterized in that if the initial buffer peak energy value ($p_{max}^2$) below the first target level ($4L_P$), an average filter energy value ($u_{avg}^2$) is determined from the samples in the filter and is compared to a second target level ($3L_U$); that the current correction factor (S) is reduced by a second modification factor (0.5) if the average filter energy value is greater than the second target level; and that a new total gain factor ($G_{NEW}$) is then determined by adjusting the current total gain factor ($G_{OLD}$) with the resulting correction factor (S).

4. Method according to claim 3, characterized in that if the average filter energy value ($u_{avg}^2$) was detected not to be greater than the second target level ($3L_U$), an average equalizer energy value ($x_{avg}^2$) is determined from the samples in the equalizer and is compared to a third (1.19 $L_X$) and a fourth (0.84 $L_X$) target level; that current correction factor (S) is reduced by a third modification factor (0.89) if the average equalizer energy value is greater than the third target level (1.19 $L_X$), and is increased by a fourth modification factor (1.12) if the average equalizer energy value is less than the fourth target level (0.84 $L_X$); and that a new total gain factor ($G_{NEW}$) is then determined by adjusting the current total gain factor ($G_{OLD}$) with the resulting correction factor (S).

5. Method according to claim 4, characterized in that an adjustment of the total gain factor with the resulting correction factor (S) in response to the comparison of the average equalizer energy value ($x_{avg}^2$) to third (1.19 $L_X$) and fourth (0.84 $L_X$) target levels is effected only if the last gain correction due to a buffer energy or filter energy comparison did not occur within a predetermined number of consecutive operation cycles.

6. Method according to claim 1, characterized in that for adjusting the two gain values (G1, G2) of the analog amplifier and the digital amplifier in combination to a new total gain value ($G_{NEW}$), at first one of the two gain values is adjusted alone to the new total gain value and the other one is maintained; that thereafter a comparison of both gain values to respective range limits (G1=1, G1=16, G2=2G2$_{NOM}$, G2=0.5G2$_{NOM}$) is made; and that then, if one of the two gain values is beyond one of its respective range limits, the total gain is newly distributed in a swapping operation by multiplying one of the two gain values by a given adaptation factor (2) and dividing the other one by the same adaptation factor so that the required total gain factor is not changed during or after the swapping operation.

7. Method according to claim 6, characterized in that a new gain value (G2) for the digital amplifier is made effective only with a delay which corresponds to the propagation time of signals from the input of the analog amplifier (G1) to the input of the digital amplifier (G2), so that even during and after a swapping operation each signal sample is effectively amplified by the required total gain factor.

8. Method according to claim 1 or to one of claims 2, 3, and 4, characterized in that prior to adjusting the total gain factor (G) with the resulting correction factor (S), a test is made whether the adjusted total gain factor is within given limits ($G_{MIN}$, $G_{MAX}$), and that no adjustment of the total gain factor is made if as a result of the adjustment the new total gain factor would fall outside the range given by the limits.

9. Method of adjusting the gain in a modem receiver in response to a sampled received signal, said receiver comprising the sereis arrangement of at least one amplifier, a buffer, a digital filter and a digital equalizer, characterized by the steps of:
(a) determining a total gain factor (G) in response to the energy of the signal samples comprised in the buffer, the digital filter, and the equalizer; and
(b) adjusting the combined effective gain of all receiver amplifiers to the gain factor determined in step (a), and rescaling the values of the samples contained in the buffer, the digital filter, and the equalizer to the new gain factor, so that no signal samples stored in the receiver are lost because of the gain factor adjustment.

10. Method according to claim 9, for adjusting the gain in a modem receiver comprising two amplifiers (15, 19), characterized in that two gain control signals (G1, G2) are provided for the two amplifiers, whose product equals the total gain factor (G); that for adjusting the combined effective gain, at first one of the gain control signals (G2) is changed while maintaining the value of the other gain control signal (G1); and that thereafter a test is made whether the gain control signal values are within given limits, and that in case of a negative result one of the two gain control signals is multiplied by a predetermined factor and the other is divided by the same factor so that the gain control signals fall within the given limits but the overall effective gain remains constant.

11. Method for adaptively adjusting the gain (G) in a modem receiver in response to a received training signal, said receiver comprising at least one amplifier to which a plurality of delay line means (21, 23, 27) are sequentially connected, characterized by the following steps:
  initially setting a gain correction factor (S) to one;
  generating for each delay line means an energy indicator ($p_{max}^2$, $u_{avg}^2$, $x_{avg}^2$) from the samples stored in the delay means line;
  comparing sequentially each energy indicator to a respective target value ($4L_P$, $3L_U$, 1.19 $L_X$) and reducing the correction factor to a predetermined fraction if the energy indicator is higher than its respective target value; and
  actually adjusting the gain (G) correction factor (S) if the, adjusted gain will be within given limits ($G_{MIN}$, $G_{MAX}$).

12. Method according to claim 11, characterized in that after an actual adjustment of the gain, all samples in all delay line means (21, 23, 27) are multiplied by the correction factor (S) used for the gain adjustment.

13. Method according to claim 11, characterized in that the energy indicator ($x_{avg}^2$) of the last delay line device (27) in propagation direction is also compared to a second respective target value (0.84 $L_X$); that the correction factor (S) is increased to a predetermined multiple if the energy indicator ($x_{avg}^2$) is below said adjusted by the increased correction factor if the new, adjusted gain will be within given limits.

14. Method according to claim 11, for use in a modem receiver comprising two sequential amplifiers (15, 19) and in which the total gain (G) is the product of the two partial gains (G1, G2) of the two amplifiers; characterized in that for a total gain adjustment, first one of the partial gains (G2) is adjusted by the correction factor (S); and that thereafter, if one of the partial gains falls not within given limits, the partial gains (G1, G2) are simultaneously modified so that their product, i.e. the total gain (G) is not changed but the partial gains fall within their given limits.

15. Method according to claim 11, characterized in that initially, the gain (G) is set to its highest possible value.

* * * * *